(12) United States Patent
Pan et al.

(10) Patent No.: US 7,709,940 B2
(45) Date of Patent: May 4, 2010

(54) MICRO DEVICE ENCAPSULATION

(75) Inventors: Shaoher X. Pan, San Jose, CA (US);
 Wald Siskens, Palo Alto, CA (US)

(73) Assignee: Spatial Photonics, Inc., Sunnyvale, CA (US)

( * ) Notice: Subject to any disclaimer, the term of this patent is extended or adjusted under 35 U.S.C. 154(b) by 710 days.

(21) Appl. No.: 11/379,932

(22) Filed: Apr. 24, 2006

(65) Prior Publication Data

US 2007/0249091 A1 Oct. 25, 2007

(51) Int. Cl.
 *H01L 23/02* (2006.01)
(52) U.S. Cl. .............. 257/678; 257/684; 257/690; 257/723; 257/773; 257/787; 257/794; 257/E25.062; 257/E23.001; 257/E23.02; 438/106; 438/124; 438/127

(58) Field of Classification Search ......... 257/678–733, 257/787–796, E23.001–E23.194, 777, E25.006, 257/E25.013, E25.018, E25.021, E25.027, 257/E21.614
See application file for complete search history.

(56) References Cited

U.S. PATENT DOCUMENTS

| 6,252,229 | B1 * | 6/2001 | Hays et al. ............... 250/338.4 |
| 6,888,237 | B1 | 5/2005 | Guenther |
| 6,919,630 | B2 * | 7/2005 | Hsiao .......................... 257/706 |
| 6,992,810 | B2 | 1/2006 | Pan et al. |
| 7,091,605 | B2 * | 8/2006 | Boroson et al. ............. 257/723 |
| 2005/0128564 | A1 | 6/2005 | Pan |
| 2006/0281227 | A1 * | 12/2006 | Yang .......................... 438/118 |

\* cited by examiner

*Primary Examiner*—Jasmine J Clark
(74) *Attorney, Agent, or Firm*—Fish & Richardson P.C.

(57) ABSTRACT

A packaged die includes a substrate having an upper surface and a micro device on the upper surface and an encapsulation cover comprising one or more grooves on its lower surface. The lower surface of the encapsulation cover and the upper surface of the substrate are bonded together to form a plurality of air-tight closed-loop interfaces and encapsulate the micro device.

29 Claims, 11 Drawing Sheets

MICRO DEVICE ENCAPSULATION

BACKGROUND

The present disclosure relates to the packaging of micro devices.

Assuring reliability and yield are two critical tasks for the manufacturing of micro devices, such as integrated circuits and micro electro-mechanical structures. Typically, in manufacturing micro devices, multiple micro devices are fabricated on a semiconductor wafer. The semiconductor wafer is then separated into individual dies containing individual micro devices. The electrical and optical performance of the micro devices are often tested for quality assurance on the individual dies in an ambient environment. For testing purposes, electrical and optical signals need to be properly input into the circuits in the micro device on the each die. Output electric and optical signals from the micro devices need to be properly detected and measured to analyze the functional performance of the micro devices on the dies. During testing and handling of the micro devices, the micro devices must not be contaminated by dust and pollutants in the ambient environment. Electrical and optical input and output, as well as protecting the micro devices from the environment, all need to be considered when designing packaging for the micro devices. Given the increased complexity of the micro devices and the testing requirements, a need exists for improved die packaging for the micro devices.

SUMMARY

In one general aspect, the present invention relates to an encapsulation cover for encapsulating a micro device on the upper surface of a substrate. The encapsulation cover includes one or more grooves on the lower surface of the encapsulation cover, wherein the lower surface is configured to form a plurality of air-tight closed-loop interfaces with the upper surface of the substrate to encapsulate the micro device.

In another general aspect, the present invention relates to a packaged die that includes a substrate comprising an upper surface and a micro device on the upper surface and an encapsulation cover comprising one or more grooves on its lower surface, wherein the lower surface of the encapsulation cover and the upper surface of the substrate are bonded together to form a plurality of air-tight closed-loop interfaces and encapsulate the micro device.

In another general aspect, the present invention relates to a method for encapsulating a micro device on the upper surface of a substrate. The method includes: forming one or more grooves on the lower surface of an encapsulation cover or on the upper surface of the substrate; and sealing the lower surface of an encapsulation cover to the upper surface of a substrate to form a plurality of air-tight closed-loop interfaces between the upper surface of the substrate and the encapsulation cover and to encapsulate the micro device on the upper surface of the substrate.

In another general aspect, the present invention relates to a semiconductor wafer that includes a substrate, a plurality of micro devices on the substrate, an encapsulation cover, and a plurality of spacer walls between the encapsulation cover and the substrate, wherein the spacer walls surround at least one of the plurality of micro devices to encapsulate at least the one micro device.

In another general aspect, the present invention relates to a method for encapsulating a plurality of micro devices on a substrate. The method includes forming a plurality of spacer walls on a surface of a sheet of an encapsulation cover, wherein each of the spacers walls comprises one or more side surfaces and a base face on the surface opposite to the encapsulation cover; and bonding the base faces of the spacer walls to an upper surface of the substrate to encapsulate the micro device on the substrate.

Implementations of the system may include one or more of the following. The air-tight closed-loop interfaces can circumscribe the micro device on the upper surface of the substrate. The air-tight closed-loop interfaces can be separated by one or more groove on the lower surface of the encapsulation cover. The plurality of air-tight closed-loop interfaces may not intersect with each other. At least two of the air-tight closed-loop interfaces can be connected by one or more air-tight cross interfaces. One or more air pockets can be formed by the grooves between the air-tight closed-loop interfaces and the air-tight cross interfaces. The plurality of air-tight closed-loop interfaces can be hermetically or semi-hermetically sealed. The encapsulation cover can be transparent to visible light. The encapsulation cover can include silicon or glass. The micro device can include an integrated circuit or a micro electromechanical structure.

Implementations of the system may include one or more of the following. Each of the plurality of spacer walls can include one or more side surfaces, a top face that is connected to the encapsulation cover, and a base face that is bonded to the substrate. The plurality of spacer walls and the encapsulation cover can be configured to form one or more chambers that are at least partially evacuated to encapsulate one or more of the micro devices on the substrate. The encapsulation cover can include one or more openings to allow accesses to the electric input/output terminals in electrical communication with one or more of micro devices on the substrate. The encapsulation cover can include a transparent material. At least one surface of the encapsulation cover can be coated with a layer of anti-reflective material.

Implementations may include one or more of the following advantages. The disclosed system and methods may provide an improved method and system for packaging micro devices. A micro device fabricated over a substrate may be sealed by an encapsulation cover with redundant sealing surfaces in a vacuum to create a local vacuum environment around the micro device. The redundant air-tight sealing interfaces may improve the integrity and, hence, the reliability of the vacuum environment when the encapsulated die is handled in the ambient environment. The disclosed system and methods may be are applicable to die packaging for a wide range of micro devices such as integrated circuits and micro electromechanical structures.

Implementations may also include one or more of the following advantages. The disclosed system and methods may provide an improved packaging a semiconductor wafer including a plurality of dies. The fabrication of the die packaging may be simplified by fabricating the encapsulation for a plurality of dies on a wafer in a single process. The wafer-level encapsulation may include windows for access to the electric I/O pads for each die on the semiconductor wafer, which allows wafer-level testing of the dies before the dies are cut and separated. The efficiency of the die testing therefore can be significantly improved. The encapsulation can also be made of a transparent material that allows one or more optical signals to be input and output from the dies that contain opto-electrical devices such as spatial light modulators (SLM).

Although the invention has been particularly shown and described with reference to multiple embodiments, it will be understood by persons skilled in the relevant art that various changes in form and details can be made therein without departing from the spirit and scope of the invention.

BRIEF DESCRIPTION OF THE DRAWINGS

The following drawings, which are incorporated in and form a part of the specification, illustrate embodiments of the present invention and, together with the description, serve to explain the principles, devices and methods described herein.

DETAILED DESCRIPTION

Figure 1A:
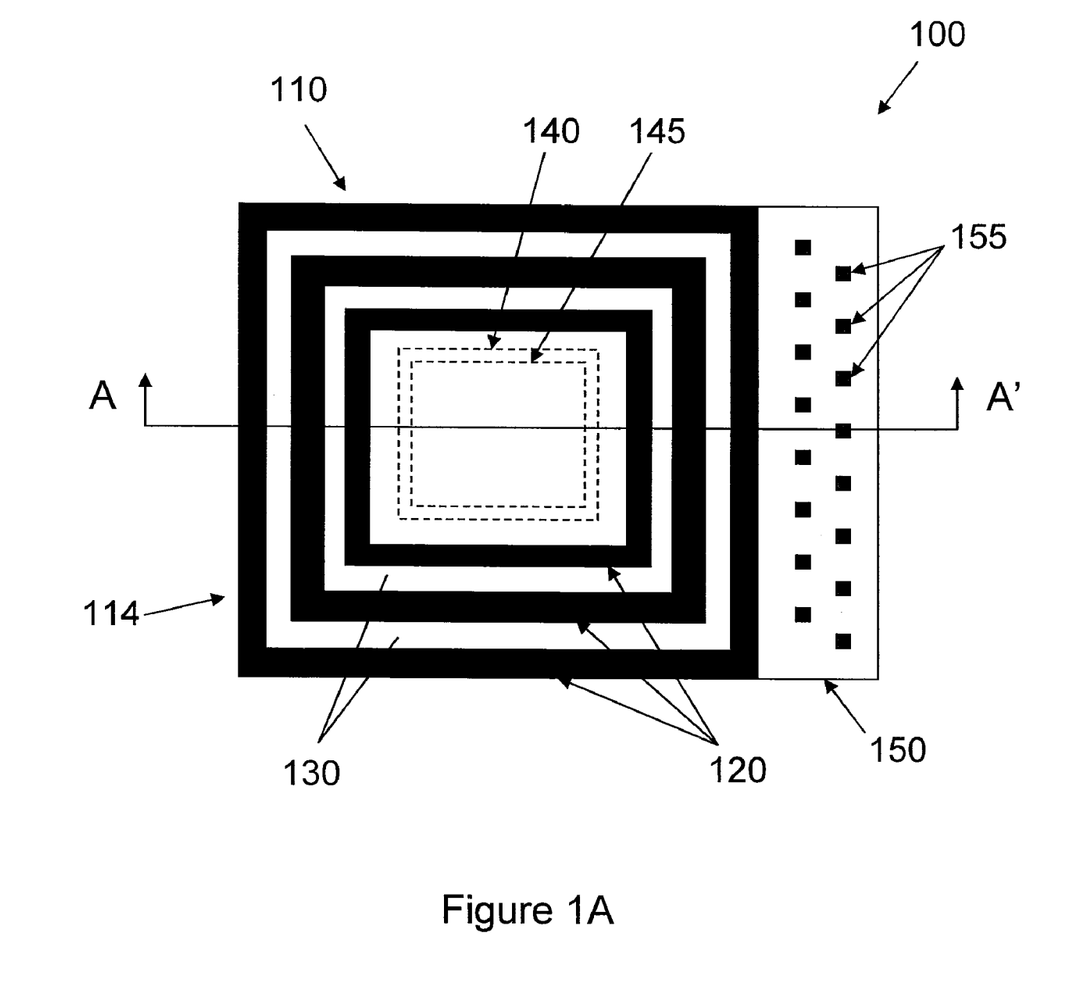
FIG. 1A illustrates the plan view of an embodiment of an encapsulated die.
Figure 1B:
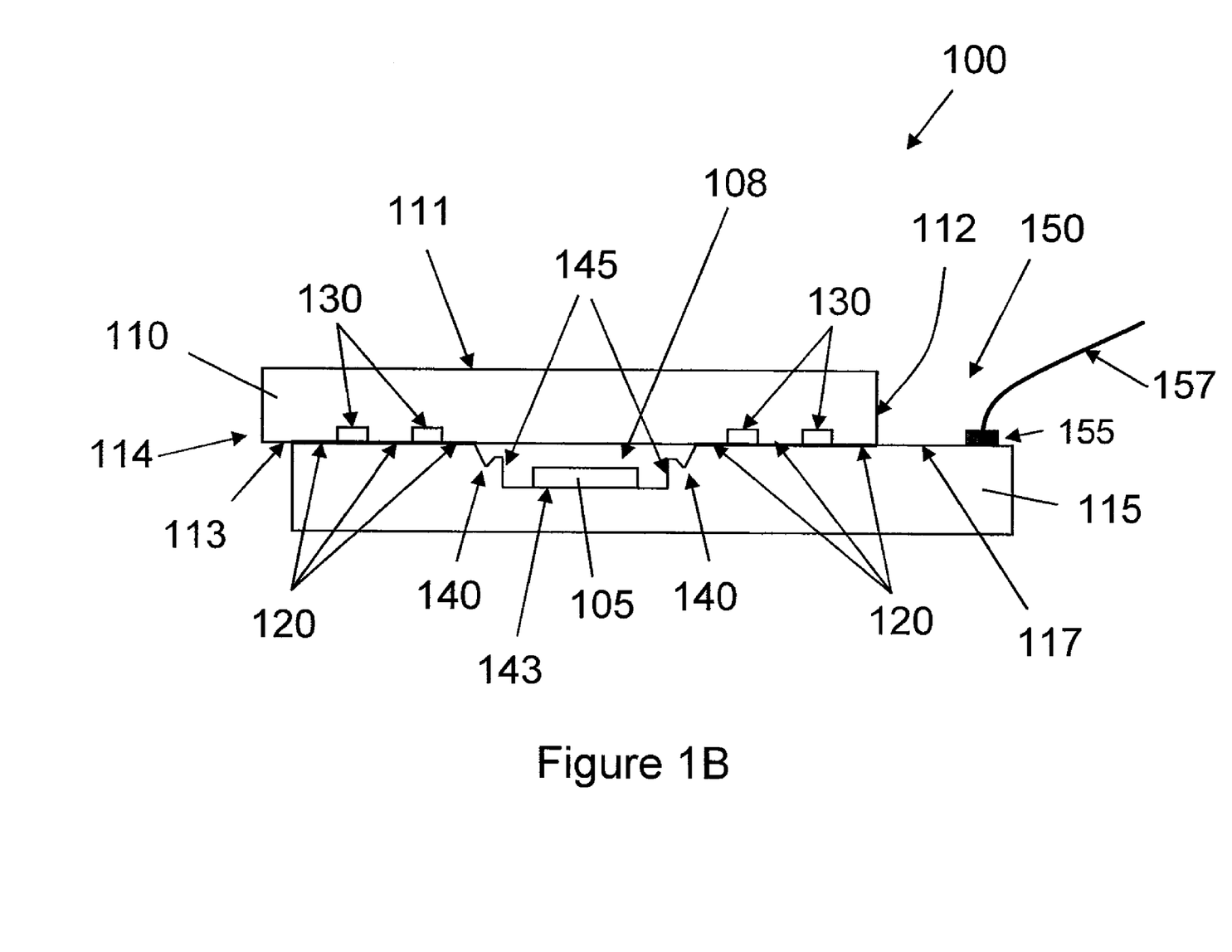
FIG. 1B is a cross-sectional view of the encapsulated die along the line A-A in FIG. 1A.

FIG. 1A illustrates a plan view of one embodiment of an encapsulated die 100. FIG. 1B shows a cross-sectional view of the encapsulated die 100 along the line A-A in FIG. 1A. The encapsulated die 100 includes a micro device 105 fabricated on a substrate 115. The micro device 105 can be fabricated in a recessed area 143 in an upper surface of the substrate 115. The recessed area 143 is surrounded by side walls 145. In another embodiment, the micro device 105 can be located on the surface of the substrate 115 instead of in a recessed area. The encapsulation cover 110 can include a recessed area that can form a cavity in which the micro device 105 can be encapsulated. The micro device 105 can include integrated circuits or micro electromechanical structures, such as central processor units (CPU) for computing devices, digital signal processors (DSP), random access memories (RAM), micro-mirror-based spatial light modulator devices (SLM), micro actuators and sensors, microfluidic devices, or other devices formed by micro fabrication techniques. The substrate 115 can have the shape of a small rectangular tablet. The substrate 115 can include a semiconductor material such as silicon, germanium, III-V materials, and so on. The substrate 115 also includes electronic contact pads 155 that are electrically connected with input and output terminals for the integrated circuits or control circuits for the micro electromechanical structures in the micro device 105. Input and output signals can be transmitted via the electric leads 157 to the electronic pads 155.

In the present specification, a die refers to a piece of semiconductor material that contains a micro device, such as an integrated circuit or a micro electro-mechanical structure. As known in semiconductor packaging, a die can be obtained by cutting a semiconductor wafer that contains a plurality of micro devices. In some fabrication techniques, the semiconductor wafer is first partially sawed along scribe lines between the micro devices. The wafer is then scribed and broken into individual die pieces so that each die constitutes an individual device.

The micro device 105 is then encapsulated by an encapsulation cover 110. In some embodiments, multiple micro devices 105 are encapsulated by an encapsulation cover 110. The encapsulation cover 110 can be made of a material transparent in the visible (and/or UV and IR) spectrum to allow the encapsulated micro device 105 to be seen by a user. The transparent material can include silicon or glass. A transparent encapsulation cover 110 serves as a window for the micro device 105, which allows for external microscopic examinations and testing. The encapsulation cover 110 can be shaped like a rectangular tablet that has a substantially flat lower surface 113 to allow tight sealing with the upper surface 117 of the substrate 115. The top surface 111 can also be flat and substantially parallel to the lower surface 113. The encapsulation cover 110 can have one or more side surfaces 112. The top surface 111 and the lower surface 113 can be coated with a layer of anti-reflective coating to help a clear view of the micro device 105 through the encapsulation cover 110 from outside.

The encapsulation cover 110 can have a similar rectangular shape as the substrate 115. The encapsulation cover 110 is situated so that the electronic pads 155 are not covered, which allows electric signals to be input to the micro device 105 for functional testing and quality control of the micro device. The transparent encapsulation cover 110 above the die allows an electro-optical device, such as an SLM device to be fully tested by allowing incident light on the SLM device and output light signals from the SLM device to be detected outside of the cover. The encapsulation cover 110 optionally includes a lip 114 that extends beyond the substrate 115, which allows easy handling of the encapsulation cover 110 before it is sealed to the substrate 115 and for easy removal when the encapsulation cover 110 needs to be removed from the substrate 115.

The lower surface 113 of the encapsulation cover 110 is hermetically or semi-hermetically sealed to the upper surface 117 of the substrate 115 in vacuum. Air-tight closed-loop interfaces 120 are formed between the upper surface 117 of the substrate 115 and the lower surface 113 of the encapsulation cover 110. One, two, three, four or more closed-loop interfaces 120 can be between encapsulation cover 110 and substrate 115. Each closed-loop interface 120 entirely circumscribes or surrounds the associated recessed area 143 and the micro device 105. The sealing can be achieved by bonding, for example by plasma surface activated bonding, or by applying adhesives to the interface before pressing the encapsulation cover 110 against the substrate 105. The substrate 115 can include getters 140 that are connected with the lower surface 113 of the encapsulation cover 110 in the chamber 108 for adsorbing moisture condensed at the lower surface 113. The getters 140 also include one or more channels that can collect the condensed moisture in the chamber 108. Because the encapsulation cover 110 and substrate 115 are sealed together in vacuum, the recess area 143 over the upper surface 117 of the substrate 115 forms a vacuum or partial vacuum environment in the chamber 108 around the micro device 105. Alternatively, the micro device 105 can be sealed in a gas environment, such as nitrogen or dry air, in which case the device is not sealed in a vacuum. The air-tight sealing at the closed-loop interfaces 120 allows the encapsulated die 100 to be moved to an ambient environment without exposing the micro device 105 to the dust and particles in the air.

The encapsulation cover 110 includes one or more grooves 130 that define the locations of the closed-loops around the recess area 143 where the micro device 105 is located. The grooves 130 form loops of air gaps between adjacent air-tight closed-loop interfaces 120. For an encapsulation cover 110 having a side in the range of 5 mm to 20 mm, the grooves may have a width in the range of 0.1 mm to 3 mm. The air-tight closed-loop interfaces 120 do not intersect with each other and, thus, form separate and redundant sealing interfaces for the micro device 105. The redundant sealing interfaces for the micro device 105 improve reliability for the vacuum in the air-tight chamber 108 for the micro device 105. In other words, after the encapsulated die 100 is moved to an ambient environment, no air can leak to the chamber 108, even if one air-tight closed-loop interface 120 is broken, as long as other air-tight closed-loop interfaces 120 remain intact.

In another embodiment, grooves can be formed in the upper surface 117 of the substrate 115. The formation of the grooves can be implemented by for example by etching the upper surface 117 of the substrate 115. The lower surface 113 of the encapsulation cover 110 can be kept flat. Similar to the description above, air-tight closed-loop interfaces 120 can form after the flat lower surface 113 of the encapsulation cover 110 is bonded to the grooved upper surface 117 of the substrate 115.

Figure 2A:
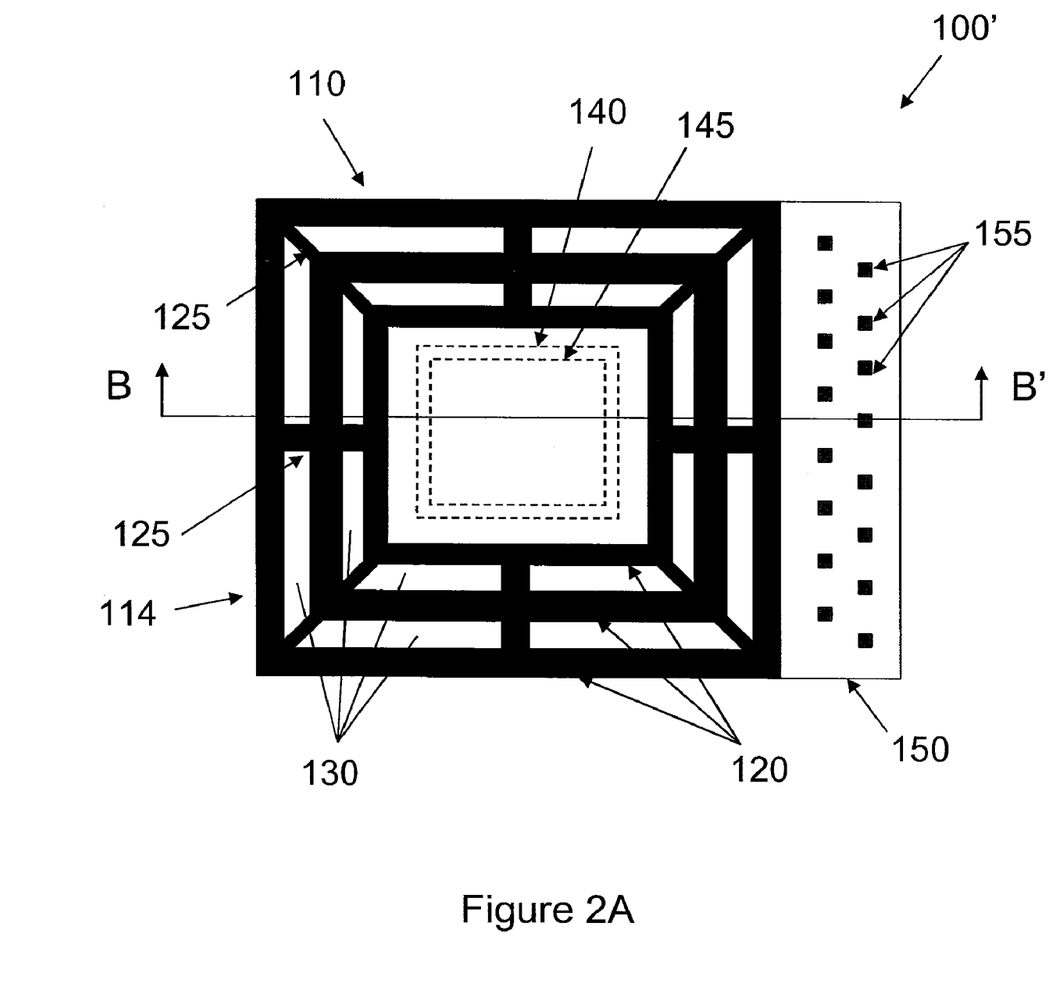
FIGS. 2A and 2B illustrate the plan view and cross-sectional view of another embodiment of an encapsulated die.
Figure 2B:
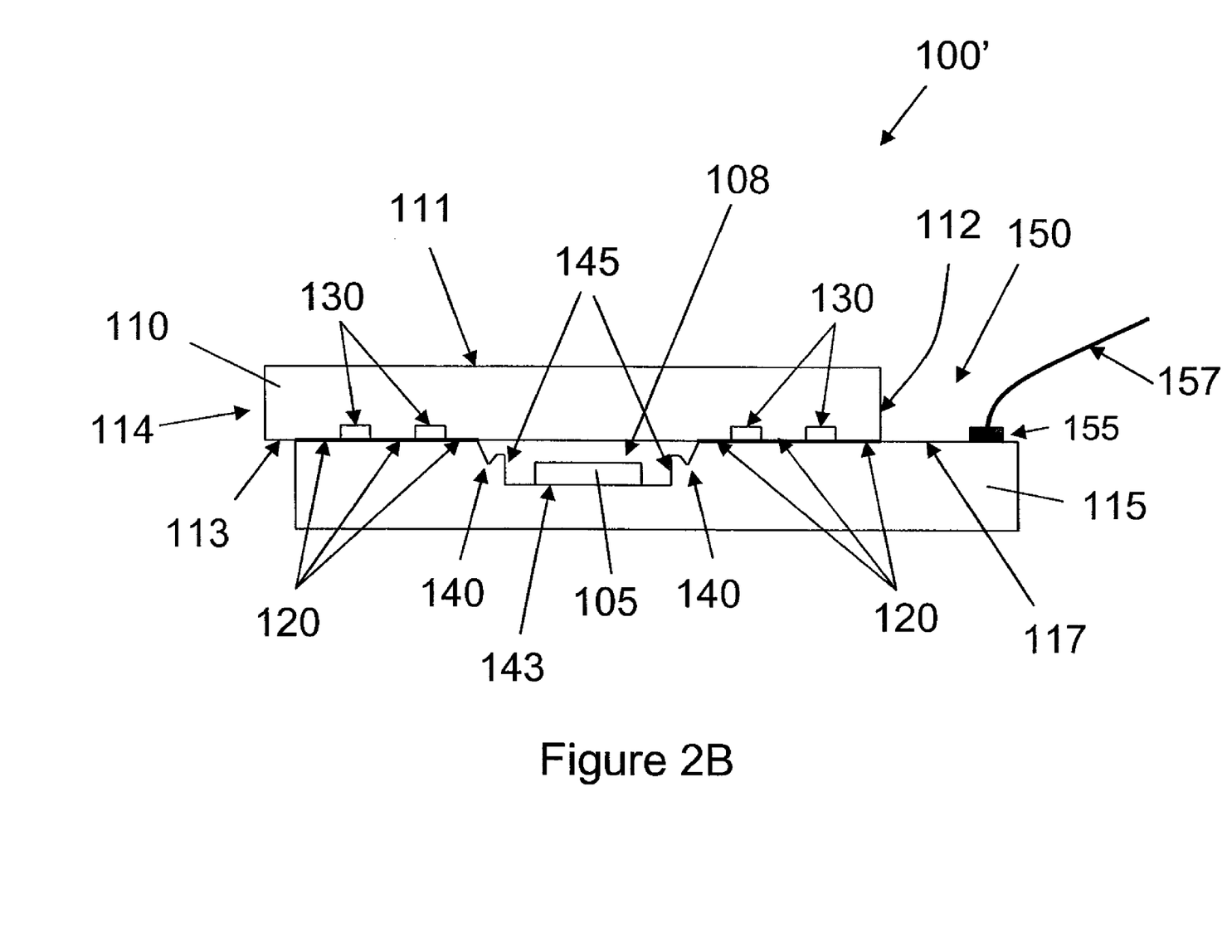

In another embodiment, the air-tight interface between the encapsulation cover and the substrate can form a plurality of sealed air pockets. FIGS. 2A and 2B illustrate the plan view and encapsulated view of an encapsulated die 100', respectively. A micro device 105 is fabricated in a recessed area 143 surrounded by side walls 145 over a substrate 115. The micro device 105 is encapsulated by an encapsulation cover 110. The lower surface 113 of the encapsulation cover 110 is hermetically or semi-hermetically sealed to the upper surface 117 of the substrate 115 in vacuum to form air-tight closed-loop interfaces 120 and air-tight cross interfaces 125 with the upper surface 117 of the substrate 115. The air-tight closed-loop interfaces 120 are surround the micro device 105 over the center of the substrate 115. The closed-loop interfaces 120 need not be circular, but can be in any geometric configuration. The air-tight cross interfaces 125 are oriented to run air-tight cross closed-loop interfaces 120. The air-tight cross interfaces 125 extend between the closed-loop interfaces 120. A plan view of the air-tight closed-up interfaces 120 and cross interfaces 125 appears like a spin web. The sealing can be achieved for example by plasma surface activated bonding. The substrate 115 can include getters 140 for absorbing moisture in the hermetic sealing between the upper surface of the substrate 115 and the encapsulation cover 110. The recess area 143 over the upper surface 117 of the substrate 115 thus forms a vacuum or partial vacuum environment in the chamber 108 around the micro device 105. The air-tight sealing at the closed-loop interfaces 120 allows the encapsulated die 100 to be moved to an ambient environment without exposing the micro device 105 to the dust and particles in the air. In another embodiment, an encapsulation cover sheet containing a plurality of encapsulation covers 110 can be sealed to the semiconductor wafer that contains a plurality of dies 105. Each encapsulation cover 110 is in registration with its respective die 125. The substrate 115 and the encapsulation cover sheet can be partially saw cut at boundaries between separate dies, then scribed and broken to separate pieces of encapsulated die 110.

The encapsulation cover 110 includes a plurality of grooves 130 that form air pockets between the air-tight closed-loop interfaces 120 and air-tight cross interfaces 125. The air-tight closed-loop interfaces 120 form a plurality of closed loops around the recess 143. The air-tight interfaces 120 also form a closed loop around each air pocket 130. The micro device 105 in the recess 143 are thus sealed by redundant sealing interfaces 120, which provide reliability to the air-tight chamber 108 for the die after the encapsulated die 100 is moved to the ambient environment. The air pockets formed by the grooves 130 are sealed by both air-tight closed-loop interfaces 120 and air-tight cross interfaces 125. In comparison, air gaps formed by grooves 130 are sealed only by air-tight closed-loop interfaces 120 as show in FIG. 1A. Even air seal at one closed-loop interface 120 breaks, the air can usually be leaked only into one air pocket. The leakage is therefore local rather than to an entire loop as in the case shown in FIG. 1A. The sealing interfaces 120 thus represent an improvement in the redundancy of the sealing interface compared to the air-tight closed-loop interfaces 120 in FIG. 1A.

Figure 3A:
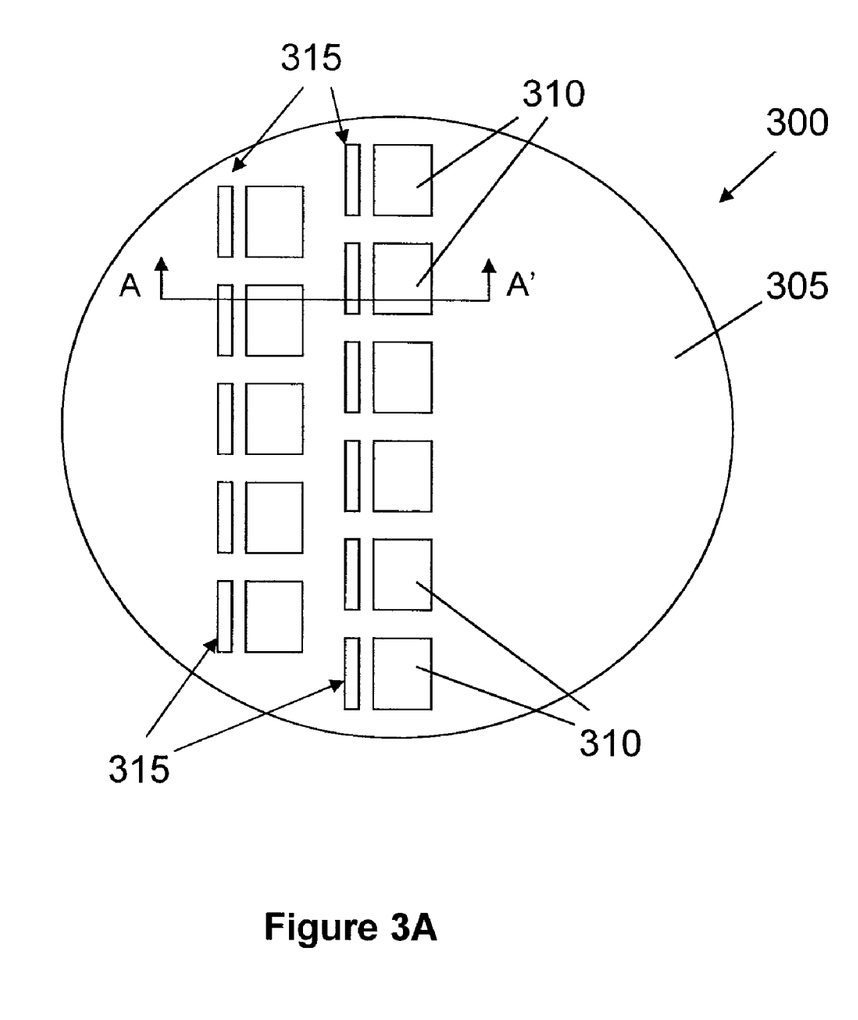
FIG. 3A is a plan view of an embodiment of a semiconductor wafer including a plurality of micro devices.
Figure 3B:
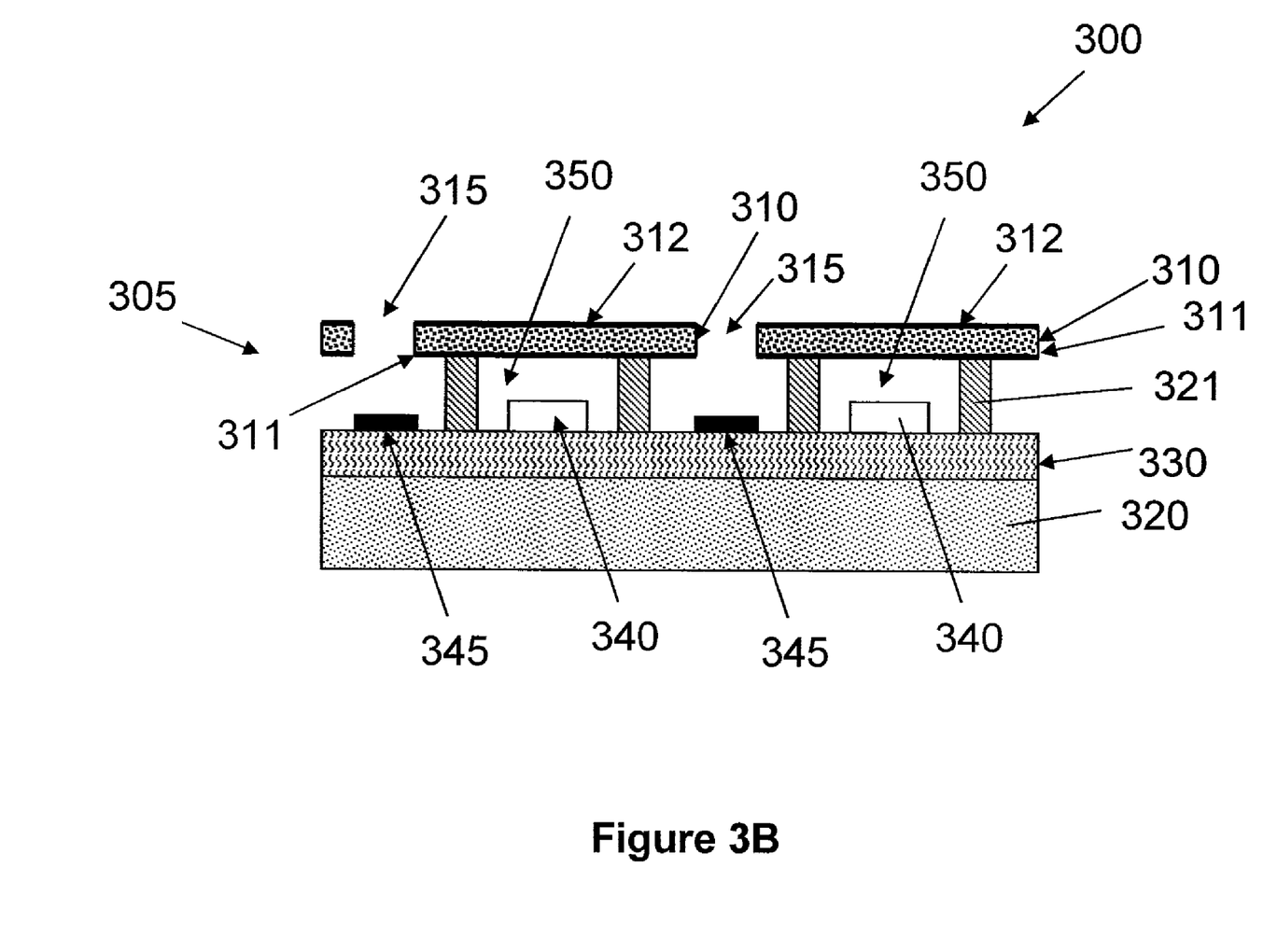
FIG. 3B is a cross-sectional view of the encapsulation along the line A-A in FIG. 3A.

FIG. 3A is a top view of a semiconductor wafer 300 including a plurality of micro devices 105. FIG. 3B is a cross-sectional view of the semiconductor wafer 300 along the line A-A in FIG. 3A. The semiconductor wafer 300 includes a semiconductor substrate 115, a control layer 330, a plurality of micro devices 105 over the control layer 330, and a plurality of Input/Output (I/O) terminals 345 for the micro devices 105. The control layer 330 includes electronic circuits that can provide input signals from the I/O terminals 345 to the micro devices 105 and output signals from the micro devices 105 to the I/O terminals 345.

The micro devices 105 are encapsulated by an encapsulation device 305 that includes an encapsulation cover 310 and a plurality of spacer walls 321. The encapsulation cover 310 can include a plurality of openings 315 each allowing access to the I/O terminals 345 for the micro devices 105. The openings 315 in the encapsulation cover 310 allow the micro devices on the semiconductor wafer 300 to be tested electronically before the semiconductor wafer 300 is cut into dies each carrying one or more micro devices 105.

The encapsulation cover 310 can be made of a transparent material such as glass to allow visual and microscopic examinations with the micro devices 105. The transparent encapsulation cover 310 also allows optical communications with micro devices 105 that are opto-electrical devices, such as micro-mirror based spatial modulation devices. Antireflective layers 312 and 311 can be coated on the top and lower surfaces of the encapsulation cover 310, respectively. The antireflective layers 312, 311 can reduce intensity loss in the incident light and output light at the surfaces of the encapsulation cover 310. Optionally, the encapsulation layer 310 is coated with one or more antireflective layers.

Each spacer wall 321 includes one or more side faces 323 and a base face 322. The spacer walls 321 can be made of silicon, silicon dioxides, or a metallic material. The spacer walls 321 can combine with the encapsulation cover 310 to form cavities over the micro devices 105. The base faces 322 of the spacer walls 321 can be hermetically bonded to the upper surface of the control substrate 330 to encapsulate the micro devices 105 in a vacuum environment. An enclosed chamber 350 can be formed to enclose a micro device 105, the chamber 350 formed by the spacer walls 321 a portion of the encapsulation cover 310 above the micro device 105. The vacuum or partial vacuum environment in the chambers 350 can be maintained by the air-tight sealing between the base faces 322 of the spacer layer and the upper surface of the control layer 330 and a seal between the spacer walls 321 and encapsulation cover 310.

Figure 4A:
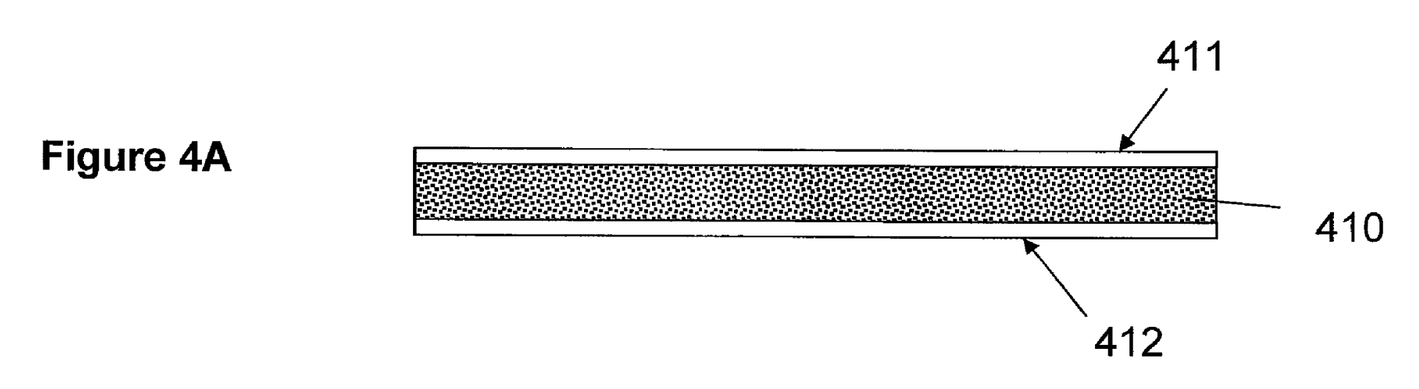
FIGS. 4A-4G illustrate steps of encapsulating micro devices.

The fabrication process of the encapsulation cover 310 is shown in FIGS. 4A-2G. FIG. 5 is a flowchart for manufacturing the encapsulation cover 310 for the semiconductor wafer 300. The cross section of a sheet 310 of a transparent material to be used to form an encapsulation cover is shown in FIG. 4A. The sheet 310 can be made of a transparent material, such as glass or silicon, and coated with anti-reflective layers 311 and 312.

In general, the anti-reflective layers 311 and 312 can be a thin film made of dielectric or metallic materials, which may include a single layer of multiple layers of such materials. The materials for the ant-reflective layer 311 and 312 can include metal oxide, silicon oxides, such as $TiO_x/SiO_x$, $NbO_x/SiO_x$, $TaO_x/SiO_x$, and $MgF_2/SiO_x$. The anti-reflective layers 311 and 312 can be made of the same or different materials. The ant-reflective layer 311 and 312 can be deposited by physical vapor deposition (PVD), chemical vapor deposition (CVD), or molecular beam epitaxy (MBE) in the vacuum environment.

The anti-reflective layers 311 and 312 reduce the light reflectance and thereby increase the light transmittance at the two surfaces of the sheet 310. The anti-reflective layers 311 and 312 create two interfaces on each side of the anti-reflective layer 311 or 312: the air/anti-reflective-layer interface and the anti-reflective-layer interface/sheet interface. The light transmittance is increased by constructive interference between the transmittance light at the two interfaces. The light reflectance is decreased by destructive interference between the reflected light at the two interfaces. The reflections from the two interfaces are 180 degrees out of phase (thus creating destructively interference with each other) if the coating is a quarter wavelength thickness and the index of refraction of the anti-reflective layer is less than that of the glass.

Figure 4B:
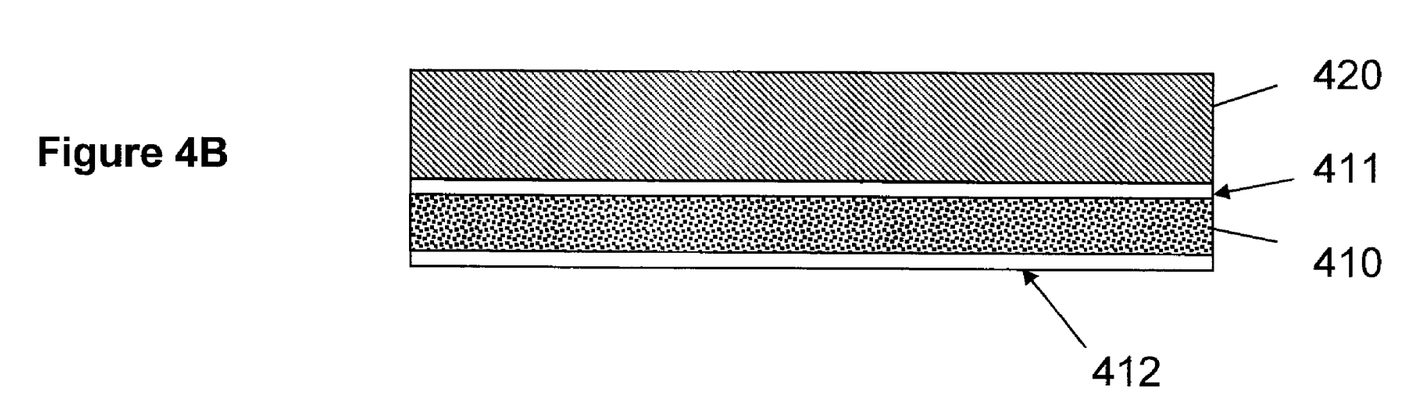
Figure 4C:
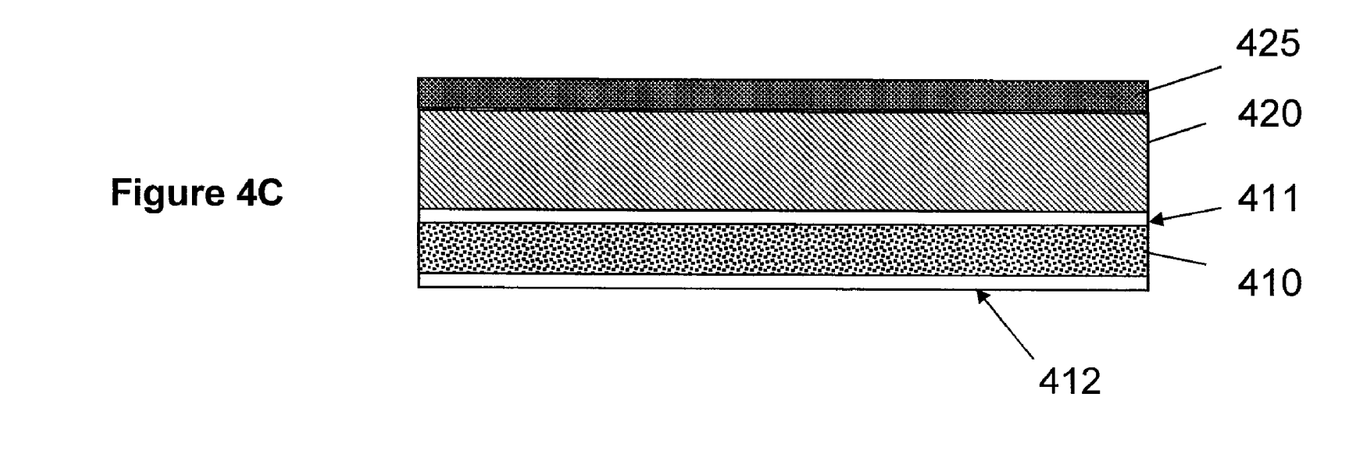
Figure 4D:
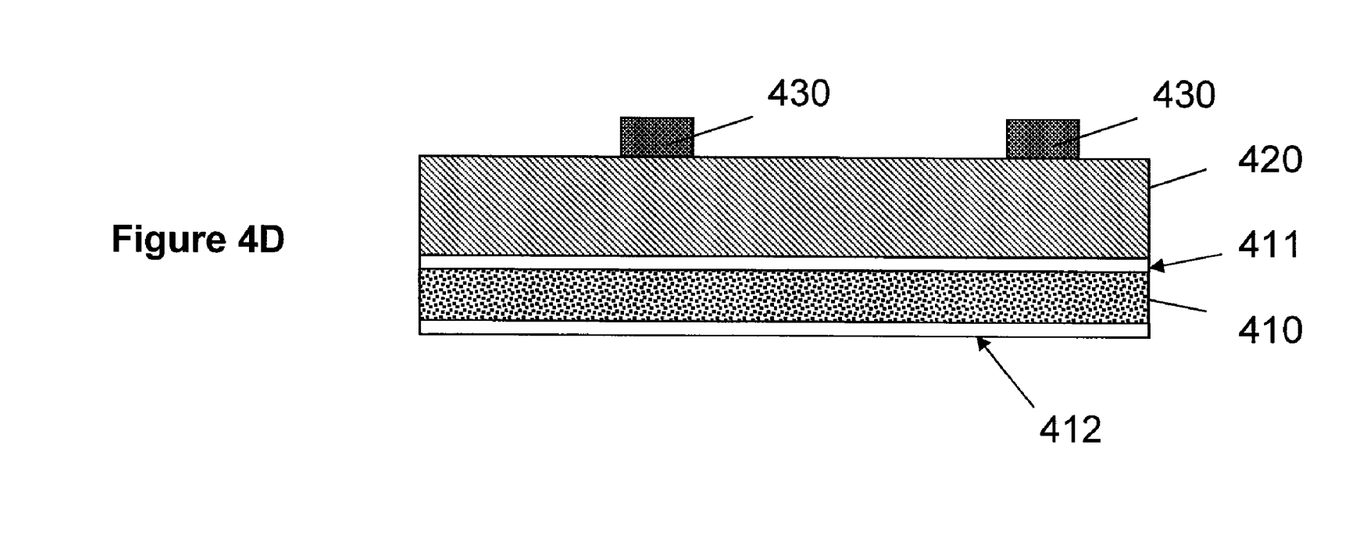
Figure 4E:
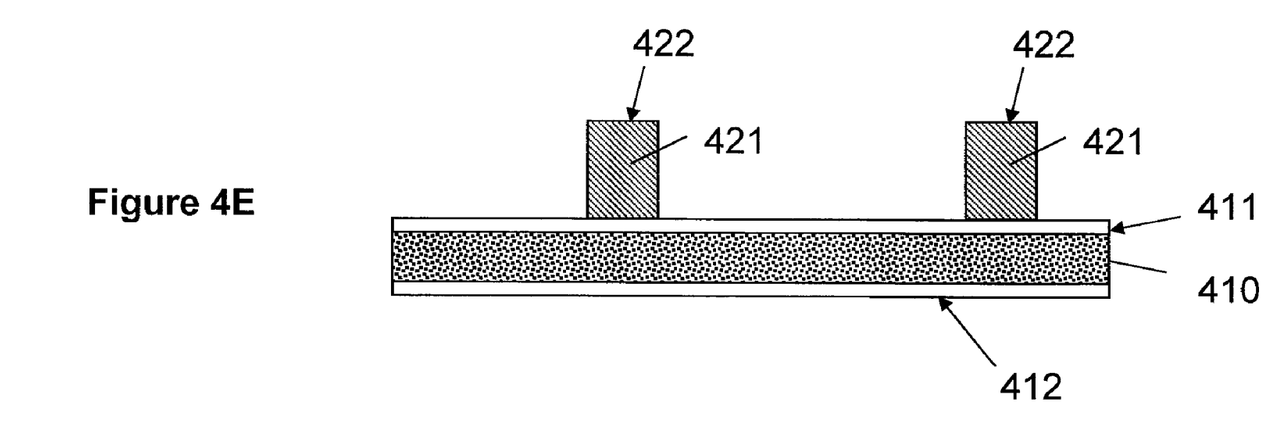
Figure 5:
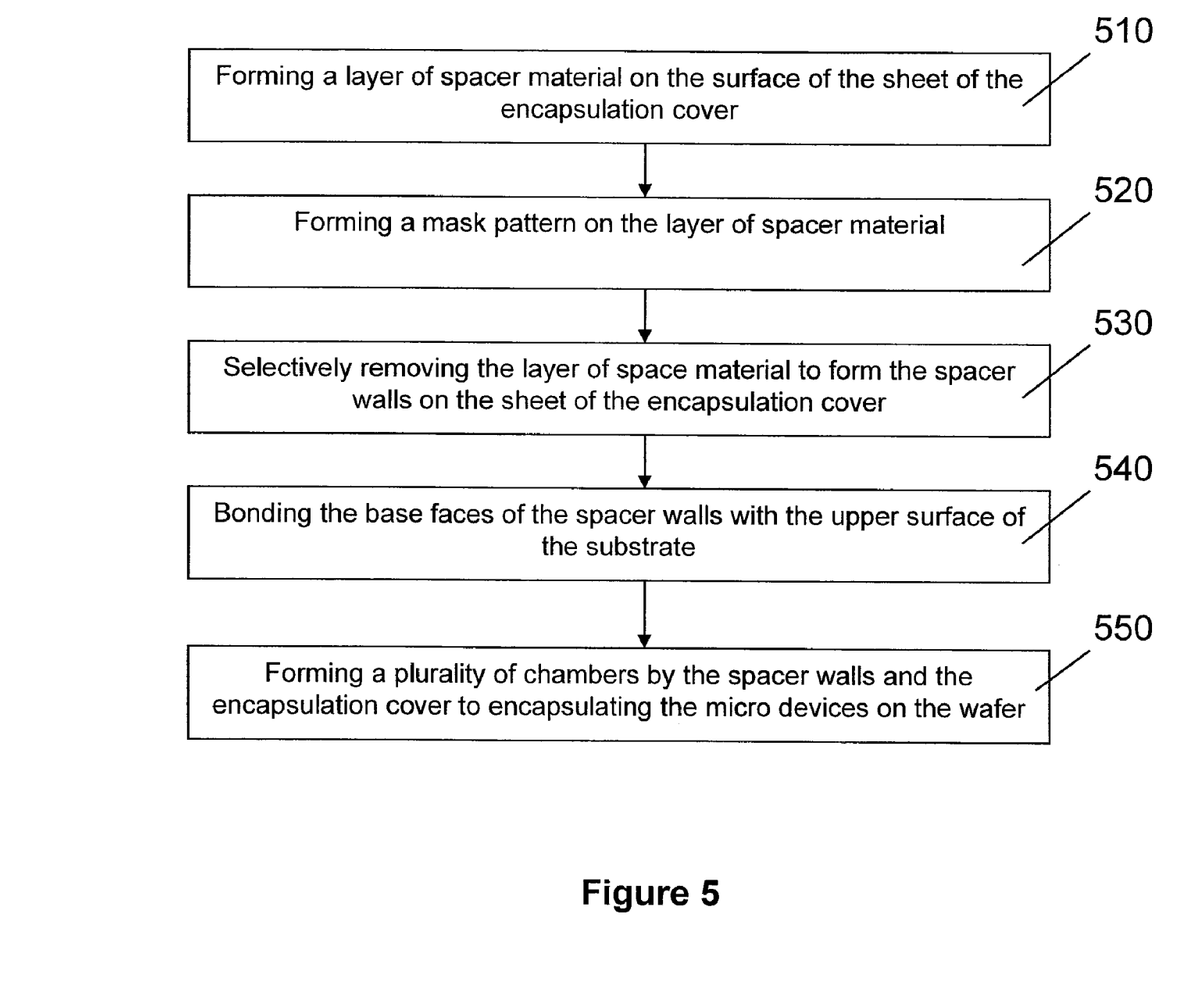
FIG. 5 is a flowchart for manufacturing the encapsulation for a semiconductor wafer.

A spacer layer 420 is then formed over the sheet 310 as shown in FIG. 4B (step 510). The spacer material can include an oxide, such as silicon oxide, silicon, or a metal. The spacer layer 420 can be deposited over the sheet 310 such as by plasma enhanced chemical vapor deposition (PECVD). A layer 425 of photo resist material is next spin-coated over the spacer layer 420, as shown in FIG. 4C. The photoresist layer 425 is then patterned by a standard photolithography process to form a predetermined mask pattern 430 (step 520), as shown in FIG. 4D. The spacer layer 420 is subsequently etched using the mask pattern 430 to form spacer walls 321 over the antireflective layer 311 (step 530), as shown in FIG. 4E. The antireflective layer 311 is positioned toward the interior of the chambers 350 after the encapsulation device 305 is sealed to the semiconductor wafer. The antireflective layer 312 is positioned on the outside of the semiconductor wafer 300.

Figure 4F:
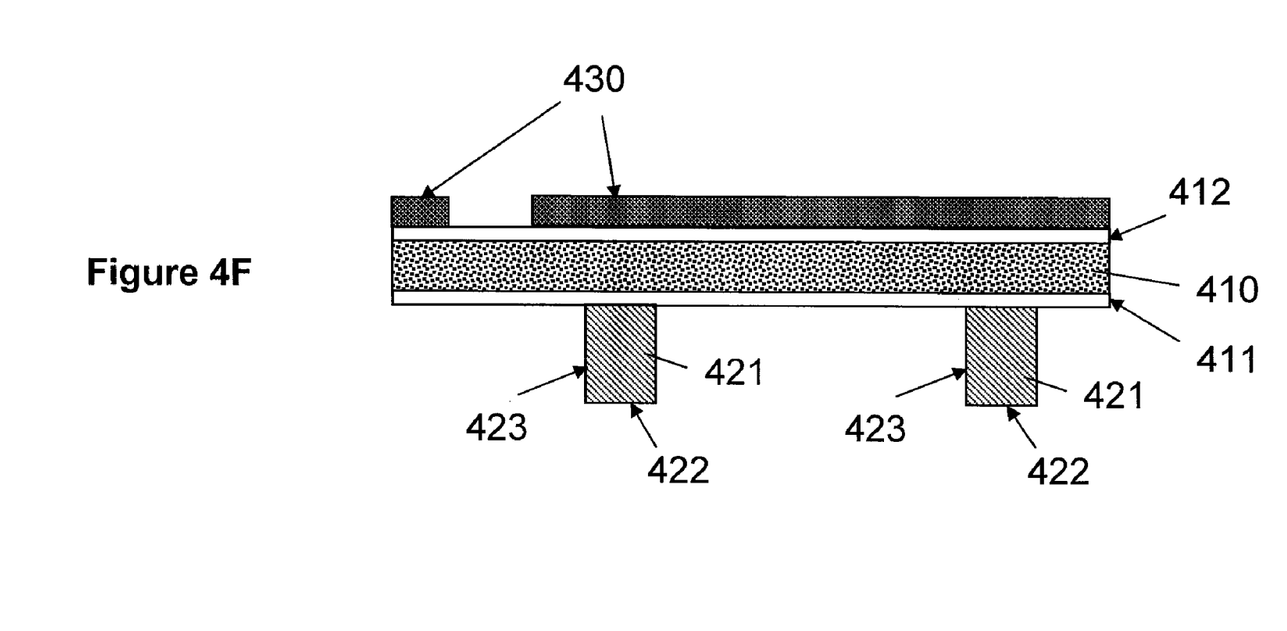
Figure 4G:
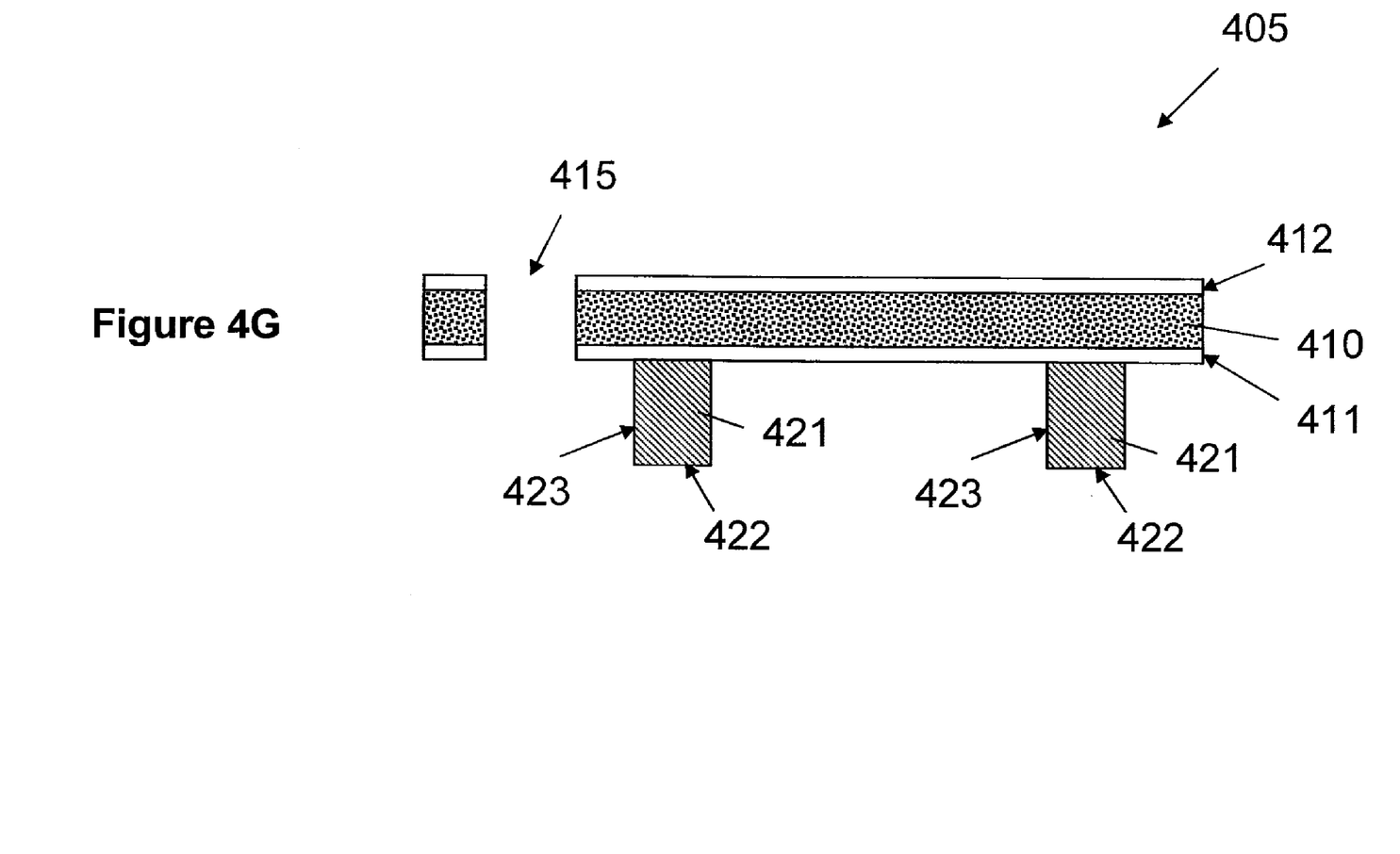

The sheet 310 is then flipped to have the exterior surface the antireflective layer 312 facing up. A photoresist mask pattern 435 is formed over the antireflective layer 312 by spin-coating a layer of photo resist and photolithographic patterning, as shown in FIG. 4F. The sheet 310 and the antireflective layers 311 and 312 are then etched through using the photoresist mask pattern 435 to form an opening 315 to allow access to the electrical I/O terminals for each micro device 105 as shown in FIG. 4G (step 540). The base faces 322 of the encapsulation device 305 formed in the above described process can be bonded to the upper surface of the control layer 330 to encapsulate the micro device 105. Permanent bonding can be made by for example plasma surface activated bonding (step 550). Semi-hermetic bonding can be made using polymer epoxy. The semiconductor wafer 300 produced can include a plurality of chambers each encapsulating a micro device 105 (step 560). Each of the micro devices 105 can be tested electrically or optically on the semiconductor wafer 300.

Although multiple embodiments have been described, it will be understood by persons skilled in the relevant art that various changes in form and details can be made therein without departing from the spirit and scope of the ideas presented herein. For example, the micro devices can be fabricated over the wafer substrate in different configurations depending on the specific function and application of the micro devices. A micro device can include electric circuits having a substantially planar surface, or a three dimensional micro-electrical mechanical structure, such as a hinged and tiltable micro mirror for spatial light modulation. The configurations and materials for the encapsulation device can be varied and selected to be best suitable to each application.

It is understood that the disclosed systems and methods are compatible with other configurations of LEDs, optical fibers, and the micro mirrors. For example, the micro devices may reside in a flat area or on a step instead of a recessed area over the substrate. Multiple micro devices can be in an encapsulated recess or flat region. The sealing between the encapsulation cover and the upper surface of the substrate can be realized by many techniques and is not limited by plasma surface activated bonding. The disclosed system and methods are also compatible with different numbers and configurations of the electronic pads for input and output signals to the micro devices. The numbers and the locations of the air-tight closed loop interfaces and air-tight cross interfaces can also be varied without deviating from the spirit of the present specification.

What is claimed is:

1. A packaged die, comprising:
   a micro device on an upper surface of a substrate; and
   an encapsulation cover, wherein one of the substrate or the encapsulation cover comprises at least one groove on a surface, wherein the lower surface of the encapsulation cover and the upper surface of the substrate are bonded together to form a plurality of bonded areas, the at least one groove is along a path that surrounds the micro device, at least one of the plurality of bonded areas surrounds the micro device and at least one of the plurality of bonded areas surrounds the at least one groove;
   wherein the encapsulation cover is transparent to visible light.

2. The packaged die of claim 1, wherein the lower surface of the encapsulation cover and the upper surface of the substrate are bonded together by plasma surface activated bonding.

3. The packaged die of claim 1, wherein the grooves are in the upper surface of the substrate.

4. The packaged die of claim 1, wherein the micro device is located in a recess on the upper surface of the substrate.

5. The packaged die of claim 1, wherein the substrate comprises one or more electric pads in communication with the micro device.

6. The packaged die of claim 5, wherein the one or more electric pads are located in an area on the upper surface of the substrate that is not covered by the encapsulation cover.

7. The packaged die of claim 1, wherein the at least one groove is the upper surface of the substrate.

8. The packaged die of claim 7, wherein the packaged die includes a plurality of grooves and the grooves do not intersect each other.

9. The packaged die of claim 8, wherein the plurality of grooves discontinuously surround the micro device along the path so that the at least one bonded area surrounding the micro device is connected to the at least one bonded area surrounding the at least one groove by one or more bonded areas.

10. The packaged die of claim 9, wherein one or more air pockets are formed between the lower surface of the encapsulation cover and the upper surface of the substrate in the areas where the at least one groove is formed.

11. The packaged die of claim 1, wherein the encapsulation cover comprises silicon or glass.

12. The packaged die of claim 1, wherein the micro device includes an integrated circuit or a micro electro-mechanical structure.

13. The packaged die of claim 1, wherein the micro device includes at least a first groove and a second groove, wherein the first groove is along a first path surrounding the micro device and the second groove is along a second path surrounding the micro device, wherein the first and second paths are different distances from the micro device.

14. A method for encapsulating a micro device on the upper surface of a substrate, comprising:
  forming at least one groove on the lower surface of an encapsulation cover or on the upper surface of the substrate, wherein the encapsulation cover is transparent to visible light;
  arranging a micro device on the upper surface of the substrate; and
  sealing the lower surface of the encapsulation cover to the upper surface of the substrate having the micro device thereon to form a plurality of bonded areas, where the at least one groove is along a path that surrounds the micro device, at least one of the plurality of bonded areas surrounds the micro device and at least one of the plurality of bonded areas surrounds the at least one groove, wherein the steps of forming, arranging and sealing form the packaged die of claim 1.

15. The method of claim 14, further comprising:
  circumscribing the micro device on the upper surface of the substrate with the at least one groove around the micro device.

16. The method of claim 14, wherein the at least one groove is in the lower surface of the encapsulation cover.

17. The method of claim 14, wherein the encapsulation cover comprises silicon or glass.

18. A semiconductor wafer assembly, comprising:
  a substrate;
  a plurality of micro mirror devices on the substrate;
  an encapsulation cover, wherein at least one surface of the encapsulation cover is coated with a layer of anti-reflective material;
  a plurality of spacer walls between the encapsulation cover and the substrate, wherein the spacer walls surround at least one of the plurality of micro devices to encapsulate the at least one micro device; and
  an additional spacer wall, wherein the plurality of spacer walls form a plurality of closed loops around the micro mirror device and the additional spacer wall is between and contacts adjacent closed loops.

19. The semiconductor wafer assembly of claim 18, wherein each of the plurality of spacer walls comprises one or more side surfaces, a top face that is connected to the encapsulation cover, and a base face that is bonded to the substrate.

20. The semiconductor wafer assembly of claim 19, wherein the plurality of spacer walls and the encapsulation cover are configured to form one or more chambers that are at least partially evacuated to encapsulate one or more of the plurality of micro mirror devices on the substrate.

21. The semiconductor wafer assembly of claim 18, wherein the encapsulation cover comprises one or more openings to allow access to electric input/output terminals in electrical communication with one or more of micro mirror devices on the substrate.

22. The semiconductor wafer assembly of claim 18, wherein the encapsulation cover comprises a transparent material.

23. A method for encapsulating a plurality of micro mirror devices on a substrate, comprising:
  forming a plurality of spacer walls on a surface of a sheet of an encapsulation cover, wherein each of the spacers walls comprises one or more side surfaces and a base face on the surface opposite to the encapsulation cover and the encapsulation cover is coated with a layer of anti-reflective material, wherein forming a plurality of spacer walls includes forming an additional spacer wall, wherein the plurality of spacer walls form a plurality of closed loops around the micro mirror device and the additional spacer wall is between and contacts adjacent closed loops; and
  bonding the base faces of the spacer walls to an upper surface of the substrate so that the spacer walls surround at least one of the plurality of micro mirror devices and to encapsulate the plurality of micro mirror devices on the substrate, wherein the steps of forming and bonding form the semiconductor wafer assembly of claim 18.

24. The method of claim 23, wherein bonding the base faces comprises forming a plurality of chambers with the spacer walls and bonding the encapsulation cover in a vacuum environment to encapsulate the micro mirror devices in a plurality of evacuated chambers.

25. The method of claim 23, wherein forming a plurality of spacer walls on a surface of a sheet of encapsulation cover comprises:
  forming a layer of spacer material on the surface of the sheet of the encapsulation cover;
  forming a mask pattern on the layer of spacer material; and
  selectively removing portions of the spacer material using the mask pattern to form the spacer walls on the sheet of the encapsulation cover.

26. The method of claim 25, further comprising forming a plurality of openings in the sheet of the encapsulation cover to allow access to electric input/output terminals in electrical communication with the plurality of micro mirror devices on the substrate.

27. The method of claim 23, wherein the substrate is a semiconductor wafer.

28. The method of claim 27, further comprising singulating the semiconductor wafer to form a plurality of dies each comprising a micro mirror device that is encapsulated by a portion of the sheet of the encapsulation cover and one or more spacer walls.

29. The method of claim 23, wherein the encapsulation cover comprises a transparent material.

* * * * *